United States Patent
Akaike et al.

(10) Patent No.: US 9,225,342 B2
(45) Date of Patent: Dec. 29, 2015

(54) OSCILLATION DEVICE

(71) Applicant: NIHON DEMPA KOGYO CO., LTD., Tokyo (JP)

(72) Inventors: Kazuo Akaike, Saitama (JP); Kaoru Kobayashi, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 0 days.

(21) Appl. No.: 14/228,251

(22) Filed: Mar. 28, 2014

(65) Prior Publication Data

US 2014/0292418 A1    Oct. 2, 2014

(30) Foreign Application Priority Data

Mar. 29, 2013 (JP) .................... 2013-074838

(51) Int. Cl.
*H03L 1/00* (2006.01)
*H03L 7/06* (2006.01)
*H03L 1/02* (2006.01)

(52) U.S. Cl.
CPC .. *H03L 7/06* (2013.01); *H03L 1/02* (2013.01); *H03L 1/022* (2013.01); *H03L 1/028* (2013.01)

(58) Field of Classification Search
CPC ............. H03L 1/02; H03L 7/06; H03L 1/022; H03L 1/028

USPC ............................ 331/18, 41, 66, 69, 70, 176
See application file for complete search history.

(56) References Cited

FOREIGN PATENT DOCUMENTS

| JP | 2012-170050 | 9/2012 |
|---|---|---|
| JP | 2012-195932 | 10/2012 |
| JP | 2013-038598 | 2/2013 |
| JP | 2013-051676 | 3/2013 |
| JP | 2013-098865 | 5/2013 |

*Primary Examiner* — Richard Tan
(74) *Attorney, Agent, or Firm* — Jianq Chyun IP Office

(57) ABSTRACT

An oscillation device corrects a setting value of an output frequency based on a detection result of an ambient temperature of a crystal unit. The oscillation device includes: an oscillation circuit; a temperature detection portion that detects the ambient temperature and outputs a digital value corresponding to the temperature detection value; an accumulator that accumulates the digital value; a rounding processing portion that performs rounding for the digital value accumulated in the accumulator; a digital filter that receives the digital value obtained from the rounding processing portion and obtains a step response gradually increasing from "0" and converging to a step value; and a correction value obtaining portion that obtains a frequency correction value of the oscillation frequency of the oscillation circuit caused by a difference between the ambient temperature and a reference temperature, wherein the setting value of the output frequency is corrected based on the frequency correction value.

8 Claims, 17 Drawing Sheets

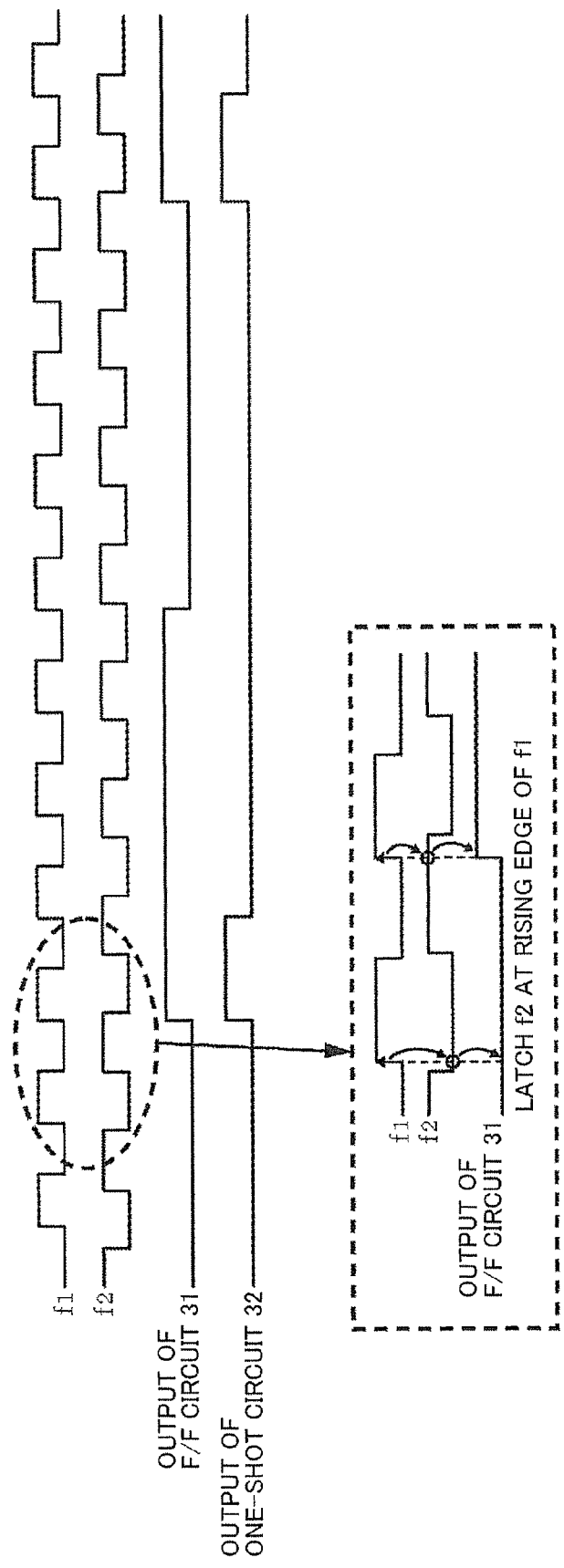

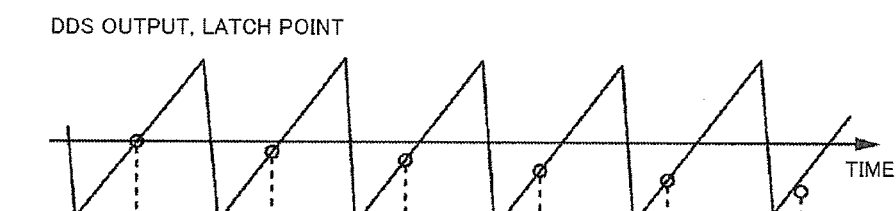
FIG.4A
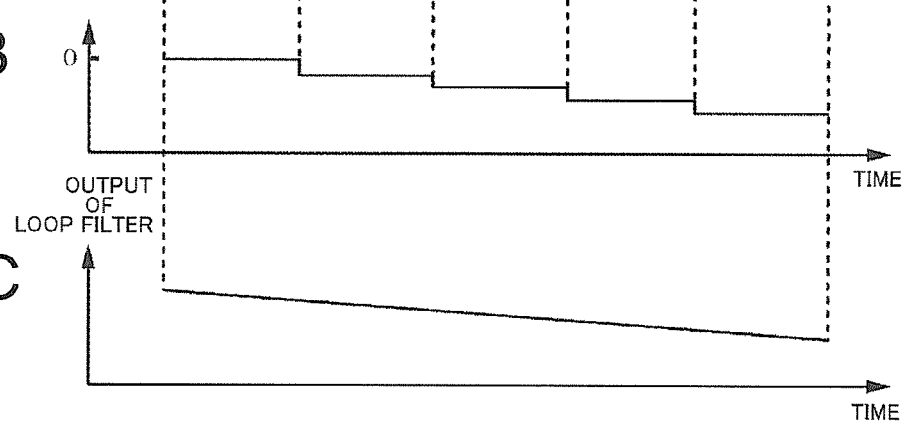
FIG.4B
FIG.4C

| | A (INPUT) | B | C | D (OUTPUT) | E |
|---|---|---|---|---|---|
| -2 | 0 | 0 | 0 | 0 | 0 |
| -1 | 0 | 0 | 0 | 0 | 0 |
| 0 | 0 | 0 | 0 | 0 | 0 |
| 1 | 1000 | 1000 | 0 | 0 | 0 |
| 2 | 1000 | 1750 | 1000 | 250 | 750 |
| 3 | 1000 | 2313 | 1750 | 438 | 1313 |
| 4 | 1000 | 2734 | 2313 | 578 | 1734 |
| 5 | 1000 | 3051 | 2734 | 684 | 2051 |
| 6 | 1000 | 3288 | 3051 | 763 | 2288 |
| 7 | 1000 | 3466 | 3288 | 822 | 2466 |
| 8 | 1000 | 3600 | 3466 | 867 | 2600 |
| 9 | 1000 | 3700 | 3600 | 900 | 2700 |
| 10 | 1000 | 3775 | 3700 | 925 | 2775 |
| 11 | 1000 | 3831 | 3775 | 944 | 2831 |
| 12 | 1000 | 3873 | 3831 | 958 | 2873 |
| 13 | 1000 | 3905 | 3873 | 968 | 2905 |
| 14 | 1000 | 3929 | 3905 | 976 | 2929 |
| 15 | 1000 | 3947 | 3929 | 982 | 2947 |
| 16 | 1000 | 3960 | 3947 | 987 | 2960 |
| 17 | 1000 | 3970 | 3960 | 990 | 2970 |
| 18 | 1000 | 3977 | 3970 | 992 | 2977 |
| 19 | 1000 | 3983 | 3977 | 994 | 2983 |
| 20 | 1000 | 3987 | 3983 | 996 | 2987 |
| 21 | 1000 | 3990 | 3987 | 997 | 2990 |
| 22 | 1000 | 3993 | 3990 | 998 | 2993 |
| 23 | 1000 | 3995 | 3993 | 998 | 2995 |
| 24 | 1000 | 3996 | 3995 | 999 | 2996 |
| 25 | 1000 | 3997 | 3996 | 999 | 2997 |
| 26 | 1000 | 3998 | 3997 | 999 | 2998 |
| 27 | 1000 | 3998 | 3998 | 999 | 2998 |
| 28 | 1000 | 3999 | 3998 | 1000 | 2999 |
| 29 | 1000 | 3999 | 3999 | 1000 | 2999 |
| 30 | 1000 | 3999 | 3999 | 1000 | 2999 |

FIG.8

OSCILLATION DEVICE

CROSS-REFERENCE TO RELATED APPLICATIONS

This application claims the priority benefit of Japan application serial no. 2013-074838, filed on Mar. 29, 2013. The entirety of the above-mentioned patent application is hereby incorporated by reference herein and made a part of this specification.

TECHNICAL FIELD

This disclosure relates to an oscillation device using a crystal unit, in which an ambient temperature of the crystal unit is detected, and a setting value of an output frequency is corrected based on a result of the temperature detection.

DESCRIPTION OF THE RELATED ART

In a base station, a relay station, and the like, it is demanded to use a clock signal having significantly high stability at a low cost. In response to this demand, the applicant has proposed a temperature-compensated crystal oscillator (TCXO) that detects a value corresponding to a difference between oscillation frequencies of a pair of crystal units as a temperature detection value and corrects a setting frequency of the oscillation device based on the temperature detection value (Japanese Unexamined Patent Application Publication No. 2012-170050).

In this oscillation device, a pulse train is generated at a timing obtained by latching a pulse as an oscillation output from one of the crystal units with a pulse as an oscillation output from the other crystal unit, and the temperature detection value is generated as a digital value by inputting this pulse train into a phase-locked loop (PLL).

Since an operation of latching a pulse using a flip-flop circuit is non-synchronous, an inconsistent period may occur. For this reason, when input data is latched with an edge of the clock, it is necessary to hold the input data for a certain time around the latching edge. However, when the clock and the input data change nearly simultaneously, the output may become unstable. In addition to such an inconsistent period, a waveform of a direct digital synthesizer (DDS) used in the PLL may be coarse so as to generate a noise when the value corresponding to the oscillation frequency difference between a pair of crystal units is quantized. Finally, a variation is generated in the quantized value. In other words, an instantaneous error is generated in a relationship between the temperature to be detected and the quantized value.

For this reason, for the temperature detection value obtained from the PLL, the input value is averaged for a predetermined time using a cumulative averaging circuit in order to remove the instantaneous error. However, when the accumulation number in the cumulative averaging circuit is small, variations in the temperature detection value and the correction value of the setting frequency become significant. Therefore, a phase noise is aggravated in the oscillation output of the oscillation device. Meanwhile, when the accumulation number in the cumulative averaging circuit is large, the accumulation time increases. Therefore, when the temperature detection value monotonically increases or decreases, a change of the temperature detection value (frequency difference) in a single update becomes significant. Accordingly, a change of the correction value of the setting frequency becomes significant, and the phase error is also aggravated.

It is noted that a circuit size may disadvantageously increase if a circuit for computing the correction value of the setting frequency in the rear stage has a member for avoiding the phase noise problem.

Thus, in an oscillation device that obtains the temperature detection value as a digital value and corrects the setting value of the output frequency based on the digital value, a need exists for a technology capable of suppressing a phase noise problem in the oscillation output caused by a change of a digital value.

SUMMARY

According to an aspect of this disclosure, there is provided an oscillation device that corrects a setting value of an output frequency based on a detection result of an ambient temperature of a crystal unit, including: an oscillation circuit used for an output of an oscillator connected to a crystal unit for an oscillator output; a temperature detection portion that detects the ambient temperature and outputs a digital value corresponding to the temperature detection value; an accumulator that accumulates the digital value based on a predetermined accumulation number; a rounding processing portion that performs rounding for the digital value accumulated in the accumulator based on a predetermined rounding factor; a digital filter that receives the digital value obtained from the rounding processing portion and obtains a step response gradually increasing from "0" and converging to a step value which is an input value; and a correction value obtaining portion that obtains a frequency correction value of the oscillation frequency of the oscillation circuit caused by a difference between the ambient temperature and a reference temperature based on the output value of the digital filter, wherein the setting value of the output frequency is corrected based on the frequency correction value obtained from the correction value obtaining portion.

This disclosure relates to an oscillation device that obtains the temperature detection value as a digital value, accumulates the digital value, averages (rounding) the accumulation value, and corrects a setting value of the output frequency based on the digital value obtained through the averaging. In addition, in the rear stage of the cumulative averaging processing portion, a digital filter configured to provide a step response gradually increasing from "0" and converging to a step value as an input value is provided, so that the correction value of the setting frequency is obtained based on the output value of the digital filter. For this reason, it is possible to suppress a circuit size in the rear stage and avoid a phase noise problem in the oscillation output caused by a change of the digital value.

BRIEF DESCRIPTION OF THE DRAWINGS

The foregoing and additional features and characteristics of this disclosure will become more apparent from the following detailed description considered with the reference to the accompanying drawings.

FIG. 3 is a waveform diagram illustrating an output from a part of the circuit of FIG. 2.

FIGS. 4A to 4C are waveform diagrams schematically illustrating waveforms from each part when a loop including a DDS circuit portion is not locked.

FIG. 8 is an explanatory diagram illustrating exemplary impulse-response sequential data against digital values of each part of the digital filter.

DETAILED DESCRIPTION

Outline of Embodiment

Figure 1:
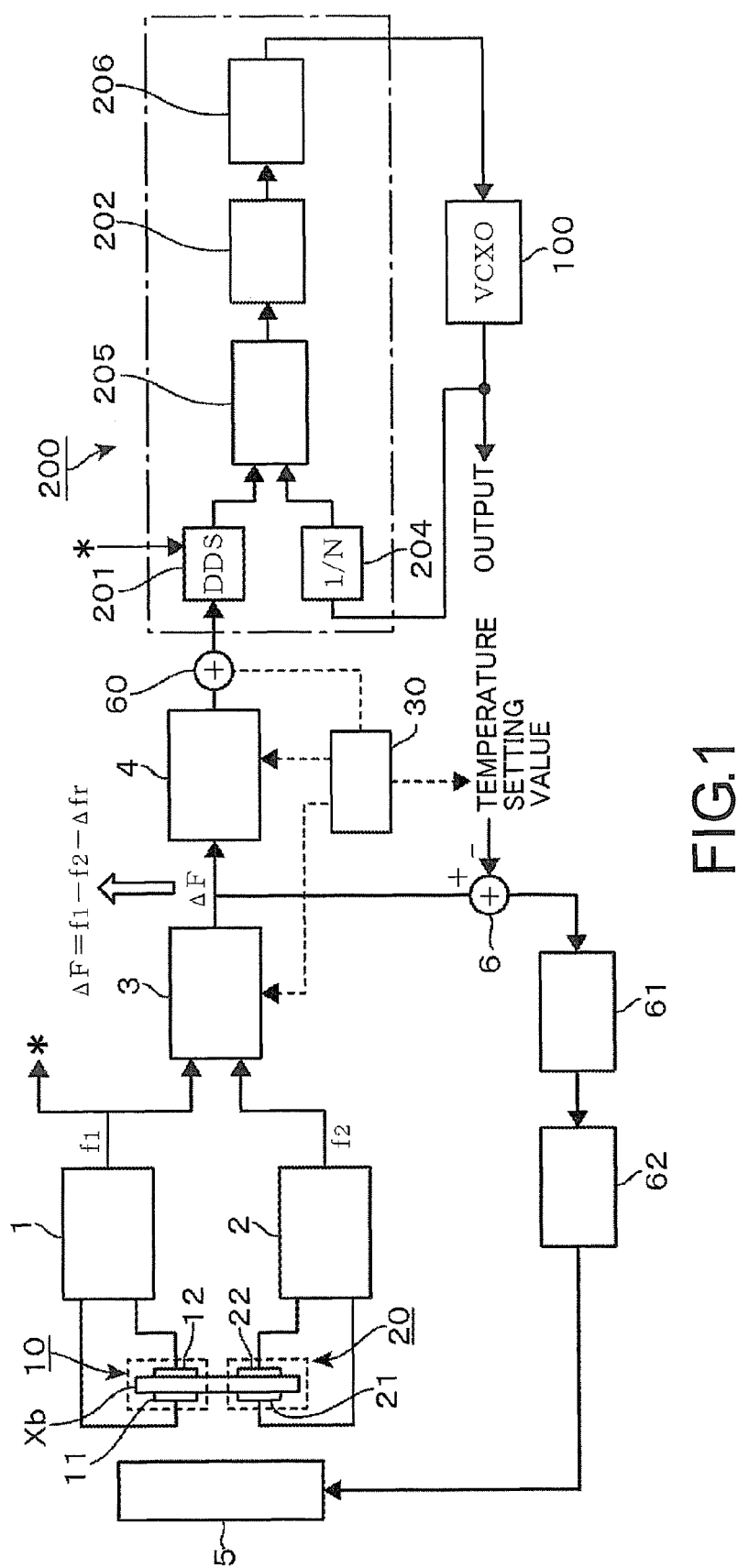
FIG. 1 is a block diagram illustrating the entire configuration according to an embodiment disclosed here.

Before a detailed description of an embodiment of this disclosure, an outline of this embodiment will be described in brief. In FIG. 1, reference numeral "200" denotes a control circuit portion in this specification. However, in practice, it generally denotes a circuit having an oscillation functionality using a phase-locked loop (PLL). Reference numeral "201" denotes a direct digital synthesizer (DDS) that outputs a reference signal used in the PLL.

As a clock signal for operating this DDS, an oscillation output of a first oscillation circuit denoted by reference numeral "1" in FIG. 1 is used. As a result, in order to stabilize an output from a voltage-controlled oscillator 100 (in this example, this output corresponds to an oscillation output as a resulting value), it is necessary to stabilize the clock signal.

In this regard, in order to stabilize the oscillation output from the first oscillation circuit 1, an ambient temperature of a crystal unit of the first oscillation circuit 1 is detected, and a frequency setting value corresponding to a setting value of the output frequency of the voltage-controlled oscillator 100 is corrected based on a temperature detection value. A computer reads data of a memory 30 and outputs the frequency setting value. That is, the oscillation device according to an embodiment disclosed here is a temperature-compensated crystal oscillator (TCXO).

A relationship between a temperature and a value corresponding to a difference between oscillation frequencies of a pair of crystal units 10 and 20 is obtained in advance, and this difference is used as the temperature detection signal. The value corresponding to the difference between the oscillation frequencies will be described below in detail. However, in order to avoid complication of terminologies, a portion used to obtain this value will be referred to as a frequency difference detection portion 3.

In this embodiment, in order to constantly maintain an ambient temperature of the crystal unit, a heater circuit 5 as a heating portion is provided, and an output ΔF of the frequency difference detection portion 3 corresponding to the temperature detection signal is used to control the heater circuit 5. Therefore, the oscillation device according to an embodiment disclosed here has both the oven-controlled crystal oscillator (OCXO) functionality and the temperature-controlled crystal oscillator (TCXO) functionality and is an oscillation device having significantly high reliability. It is noted that an embodiment disclosed here may also apply to a case where the TCXO functionality is not provided.

According to an embodiment disclosed here, the frequency difference detection portion 3 is configured to generate the aforementioned output ΔF corresponding to the temperature detection value using the PLL as described below. Then, a cumulative averaging processing is performed for the generated temperature detection value, and is further rectified by a digital filter.

DETAILED DESCRIPTION OF EMBODIMENT

Next, the entirety of an embodiment of this disclosure will be described in detail. FIG. 1 is a block diagram illustrating the entire configuration of the oscillation device obtained by applying the crystal oscillator according to an embodiment disclosed here. This oscillation device is configured as a frequency synthesizer that outputs a frequency signal having a predetermined frequency and includes: a voltage-controlled oscillator 100 having a crystal unit; a control circuit portion 200 serving as the PLL in the voltage-controlled oscillator 100; a crystal oscillator (denoted by no reference numeral) that generates a clock signal for operating the DDS 201 for generating a reference signal of the PLL; and a heater circuit 5 serving as a heating portion for controlling an ambient temperature of the crystal units 10 and 20 of the crystal oscillator.

This oscillation device also has a temperature compensation portion that performs temperature compensation for the reference clock input to the control circuit portion 200. Although no reference numeral is given for the temperature compensation portion, the temperature compensation portion corresponds to the left half of the control circuit portion 200 in FIG. 1 and is shared by a circuit portion for controlling the heater circuit 5.

In the control circuit portion 200, the phase-frequency comparison portion 205 compares a phase of the reference clock output from the DDS circuit portion 201 and a phase of the clock obtained by dividing the output of the voltage-controlled oscillator 100 using a divider 204, and a charge pump 202 changes a phase difference as a result of the comparison into an analog signal. The analog signal is input to the loop filter 206 and is controlled to stabilize the PLL. Therefore, the control circuit portion 200 may be referred to as a PLL portion. Here, the DDS circuit portion 201 receives frequency data (digital value) for outputting a desired frequency signal by using the frequency signal output from the first oscillation circuit 1 described below as a reference clock.

However, since the frequency of the reference clock has a temperature characteristic, a signal corresponding to a frequency correction value described below is added to the frequency data input to the DDS circuit portion 201 using an adder 60 in order to cancel this temperature characteristic. A temperature change equivalent of the output frequency of the DDS circuit portion 201 caused by a temperature characteristic change of the reference clock is cancelled by correcting the frequency data input to the DDS circuit portion 201. As a result, the frequency of the reference clock is stabilized against a temperature change. This stabilizes the output frequency from the voltage-controlled oscillator 100.

The oscillation device according to an embodiment disclosed here includes first and second crystal units 10 and 20. The first and second crystal units 10 and 20 are configured using a common crystal piece Xb. That is, for example, an area of a rectangular crystal piece Xb is bisectioned lengthwise, and excitation electrodes are provided on both front and rear surfaces of each bisectioned area (oscillation area). Therefore, one of the bisectioned areas and a pair of electrodes 11 and 12 constitute the first crystal unit 10, and the other bisectioned area and a pair of electrodes 21 and 22 constitute the second crystal unit 20. For this reason, it can be said that the first and second crystal units are thermally combined. In this example, an AT-cut crystal piece Xb is used.

The first and second crystal units 10 and 20 are connected to the first and second oscillation circuits 1 and 2, respectively. Any one of the outputs of the oscillation circuits 1 and 2 may be, for example, either overtones (higher harmonics) or fundamental waves of the crystal units 10 and 20. When an overtone output is obtained, for example, an overtone tuning circuit may be provided in an oscillation loop including a crystal unit and an amplifier to cause the oscillation loop to oscillate at an overtone. Alternatively, the oscillation loop may be oscillated at a fundamental wave, and a class-C amplifier may be provided in rear of the oscillation stage such an amplifier as a part of a Colpitts circuit, so that the fundamental wave is distorted using the class-C amplifier. In addition, a tuning circuit tuned to an overtone may be provided in rear of the class-C amplifier, so that, for example, a third-order overtone oscillation frequency is output from any one of the oscillation circuit 1 and 2 as a result.

Here, for convenient description purposes, assuming that a frequency signal having a frequency f1 is output from the first oscillation circuit 1, and a frequency signal having a frequency f2 is output from the second oscillation circuit 2, the frequency signal having a frequency f1 is supplied to the control circuit portion 200 as a reference clock. Reference numeral "3" denotes a frequency difference detection portion. Roughly speaking, the frequency difference detection portion 3 is a circuit portion for obtaining a difference "f2−f1−Δfr" which is a difference between a difference between the frequencies f1 and f2 and "Δfr." Here, "Δfr" denotes a difference between "f1(f1r)" and "f2(f2r)" at a reference temperature of, for example, 25° C. The difference between frequencies f1 and f2 may be, for example, several megahertz (MHz). An embodiment disclosed here is characterized in that the frequency difference detection portion 3 computes the difference ΔF between a value corresponding to a difference between the frequencies f1 and f2 and a value corresponding to the difference between the frequencies f1 and f2 at a reference temperature of, for example, 25° C. In this embodiment, more specifically, the value obtained from the frequency difference detection portion 3 is expressed as "{(f2−f1)/f1}−{(f2r−f1r)/f1r}." Note that an indication of the output of the frequency difference detection portion 3 is abbreviated in the drawings.

Figure 2:
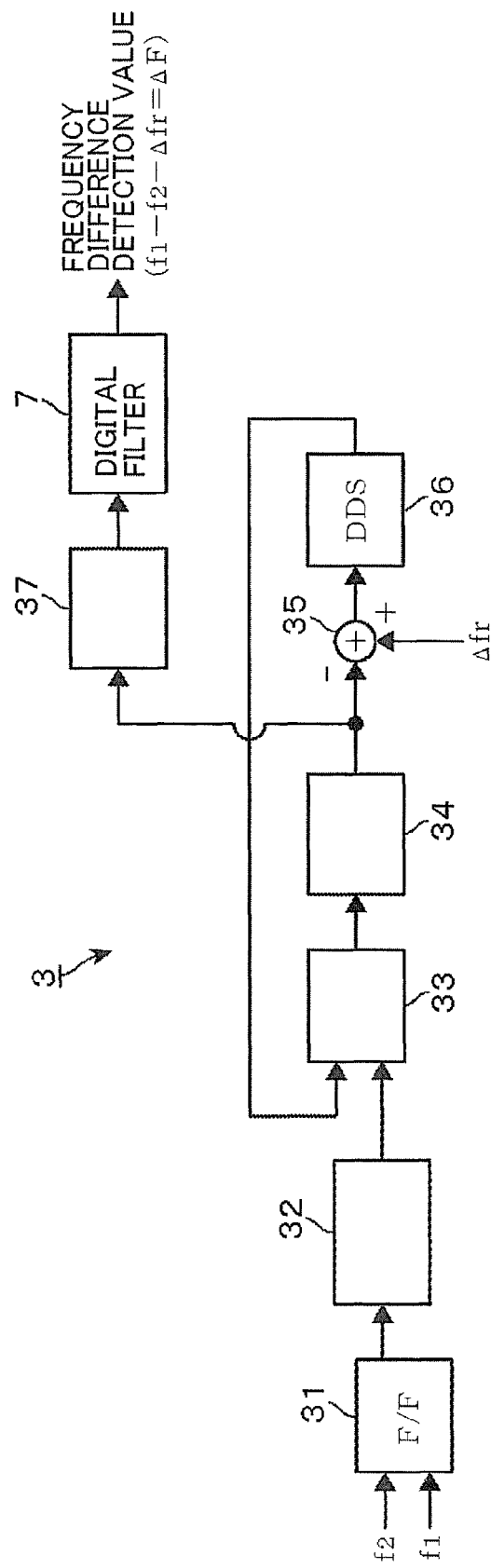
FIG. 2 is a block diagram illustrating a frequency difference detection portion according to an embodiment disclosed here.

FIG. 2 illustrates a specific example of the frequency difference detection portion 3. Reference numeral "31" denotes a flip-flop circuit (F/F circuit). The frequency signal having a frequency f1 from the first oscillation circuit 1 is input to one of the input terminals of the flip-flop circuit 31, and the frequency signal having a frequency f2 from the second oscillation circuit 2 is input to the other input terminal, so that the frequency signal having a frequency f2 from the second oscillation circuit 2 is latched by the frequency signal having a frequency f1 from the first oscillation circuit 1. In the following description, in order to avoid redundant description, it is assumed that "f1" and "f2" denote frequencies or frequency signals. The flip-flop circuit 31 outputs a signal having a frequency (f2−f1) corresponding to a frequency difference between the frequencies f1 and f2.

A one-shot circuit 32 is provided in rear of the flip-flop circuit 31. The one-shot circuit 32 outputs a one-shot pulse in synchronization with a rising edge of the pulse signal obtained from the flip-flop circuit 31. FIG. 3 is a timing chart illustrating a series of the signals described hereinbefore.

A phase-locked loop (PLL) is provided in rear of the one-shot circuit 32. This PLL includes a latch circuit 33, a first loop filter 34 having an integration functionality, an adder 35, and a DDS circuit portion 36.

The latch circuit 33 is configured to latch a sawtooth wave output from the DDS circuit portion 36 with the pulse output from the one-shot circuit 32. The output of the latch circuit 33 has the same signal level as that of the sawtooth wave at the timing of outputting the pulse. The loop filter 34 integrates a direct current (DC) voltage of this signal level, and the first adder 35 adds this DC voltage and a DC voltage corresponding to "Δfr" (difference between frequencies f1 and f2 at a reference temperature of, for example, 25° C.). Data on the DC voltage corresponding to "Δfr" is stored in a memory 30 of FIG. 1.

In this example, in the first adder 35, an input side of the DC voltage corresponding to "Δfr" has a positive sign "+," and an input side of the output voltage of the first loop filter 34 has a negative sign "−." The DDS circuit portion 36 receives a DC voltage computed by the first adder 35, that is, a voltage obtained by subtracting the output voltage of the loop filter 34 from the DC voltage corresponding to "Δfr" and outputs a sawtooth wave having a frequency corresponding to this voltage. For easy understanding of the operation of the PLL, FIGS. 4A to 4C schematically illustrate states of the outputs of each part. In addition, for intuitive understanding, description will be made significantly schematically. At the start of the operation, a DC voltage corresponding to "Δfr" is input to the DDS circuit portion 36 via the first adder 35. For example, if the value Δfr is 5 MHz, a sawtooth wave corresponding to this frequency is output from the DDS circuit portion 36.

Figure 5A:
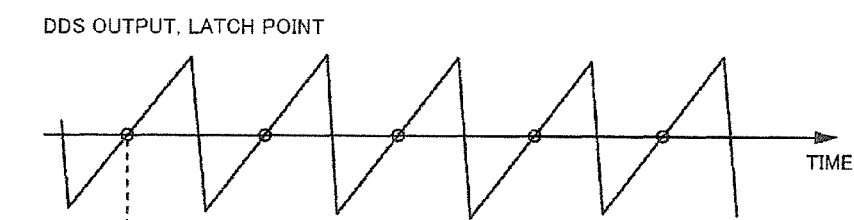
FIGS. 5A to 5C are waveform diagrams schematically illustrating waveforms from each part when the loop including the DDS circuit portion is locked.
Figure 5B:
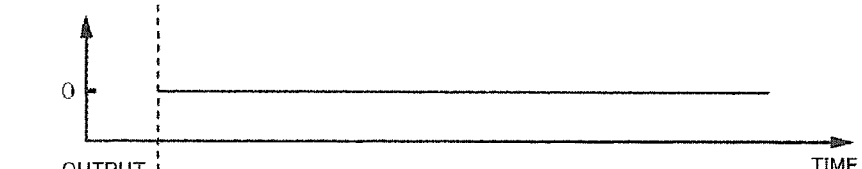
Figure 5C:
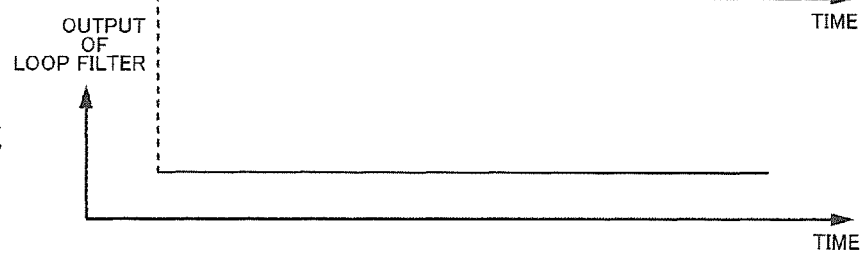

The latch circuit 33 latches the sawtooth wave with a pulse having a frequency corresponding to the difference (f2−f1). Assuming that the difference (f2−f1) is, for example, 6 MHz, a cycle of the pulse used in the latching is shorter than that of the sawtooth wave. Therefore, the latch point of the sawtooth wave is gradually lowered as illustrated in FIG. 4A, and the output of the latch circuit 33 and the output of the first loop filter 34 are gradually lowered to the negative (−) side as illustrated in FIGS. 4B and 4C. Since the output side of the loop filter 34 of the first adder 35 has a negative sign "−," the DC voltage input from the first adder 35 to the DDS circuit portion 36 increases. For this reason, the frequency of the sawtooth wave output from the DDS circuit portion 36 increases. When a DC voltage corresponding to "6 MHz" is input to the DDS circuit portion 36, the frequency of the sawtooth wave becomes 6 MHz, and the PLL is locked as illustrated in FIGS. 5A to 5C. In this case, the DC voltage output from the loop filter 34 becomes a value corresponding to "Δfr−(f2−f1)=−1 MHz." That is, it can be said that an integration value of the loop filter 34 is an integration value corresponding to a change of "1 MHz" assuming that the sawtooth wave changes from 5 MHz to 6 MHz.

Figure 6A:
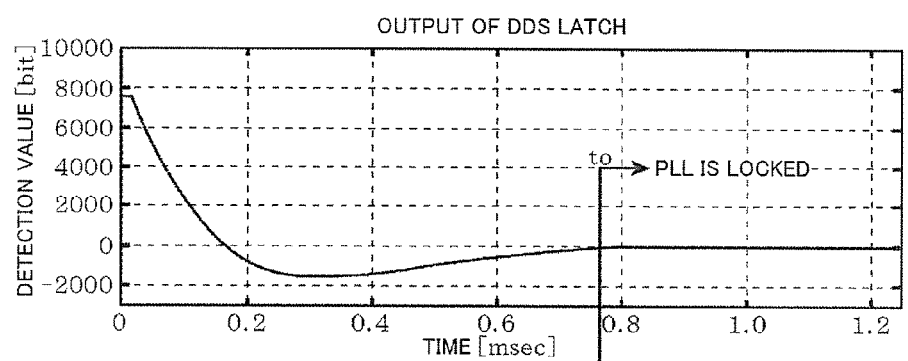
FIGS. 6A and 6B are waveform diagrams schematically illustrating waveforms from each part of the loop in an actual device according to the embodiment disclosed here.
Figure 6B:
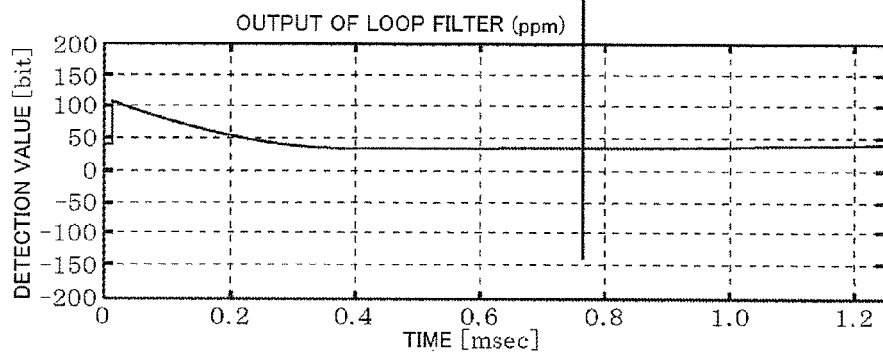

In contrast, assuming that "Δfr" is set to 6 MHz, and "(f2−f1)" is set to 5 MHz, a cycle of the latching pulse is longer than that of the sawtooth wave. Therefore, the latch point of FIG. 4A gradually rises. Accordingly, the output of the latch circuit 33 and the output of the loop filter 34 also increase. For this reason, since the subtraction value in the adder 35 increases, the frequency of the sawtooth wave gradually decreases. Finally, the PLL is locked when the frequency of the sawtooth wave becomes 5 MHz which is equal to "(f2−f1)." In this case, the DC voltage output from the loop filter 34 becomes a value corresponding to "Δfr−(f2−f1)=1 MHz." It is noted that the FIGS. 6A and 6B show actual measurement data, and in this example, the PLL is locked at timing t0.

However, as described above, in practice, the output of the frequency difference detection portion 3 is a value obtained by expressing a value "{(f2−f1)/f1}−{(f2r−f1r)/f1r}" as a 34-bit digital value. If a set of these values from the vicinity of −50° C. to the vicinity of 100° C. are expressed as "(f1−f1r)/f1r=OSC1 (ppm or ppb)" or "(f2−f2r)/f2r=OSC2 (ppm or ppb)," a change to a temperature is substantially equal to a curve of (OSC2−OSC1). Therefore, the output of the frequency difference detection portion 3 can be expressed as "(OSC2−OSC1)=temperature data."

As described in the paragraphs of Background Art, the cumulative averaging processing portion 37 that averages the input value at a predetermined time is provided in the output side of the loop filter 34 as illustrated in FIG. 2 in order to remove an instantaneous error. The cumulative averaging processing portion 37 is a circuit that accumulates the digital value from the loop filter 34 by a designated number of clock pulses and performs rounding (multiplication of "$2^{-n}$," where "n" denotes any integer) for the accumulated value based on a designated rounding factor. For example, the digital value from the loop filter 34 may be continuously accumulated 1024 times in synchronization with a clock pulse, and the accumulated value may be divided by "1024."

Figure 7:
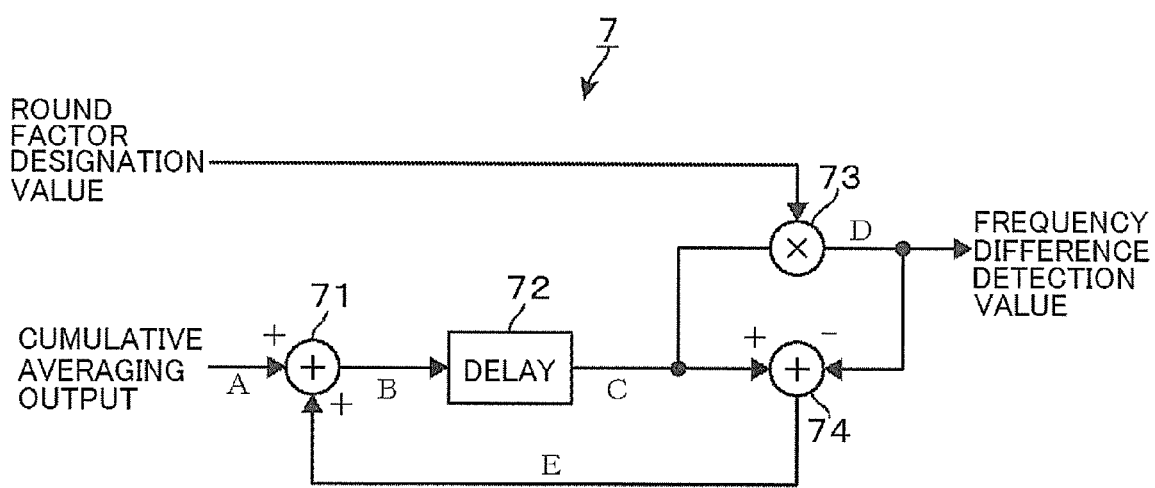
FIG. 7 is a block circuit diagram illustrating a digital filter of the frequency difference detection portion.

As illustrated in FIG. 2, a digital filter 7 such as an infinite impulse response (IIR) filter is provided in rear of the cumulative averaging processing portion 37. FIG. 7 is a block circuit diagram illustrating the digital filter in detail. The adder 71 adds the digital value from the cumulative averaging processing portion 37 to the output value from the adder 74 described below. The output value of the adder 71 in the front stage is delayed by one clock in the delay circuit 72, and the rounding processing portion 73 performs the rounding based on the designated rounding factor. The rounding is a processing of multiplying the digital value from the delay circuit 72 by "$2^{-n}$." The rounding factor is set to, for example, $2^{-3}$.

The adder 74 in the rear stage adds the digital value subjected to the rounding and the digital value before the rounding, and the adder 71 of the front stage adds the resulting addition value and the digital value from the cumulative averaging processing portion 37.

Returning to FIG. 1, the memory includes a group of registers and is configured to write data from EEPROM which is an external memory provided in the oscillation device of FIG. 1 via a sequencer. In addition, the oscillation device of FIG. 1 has, for example, an I2C interface and is connected to an external upper-layer computer via an I2C bus, so that the parameters for operating the oscillation device are written to the external memory using the upper-layer computer. The rounding factor "$2^{-n}$" used in the rounding processing portion 73 is one of the parameters described above. Therefore, it can be designated using the upper-layer computer.

Figure 9:
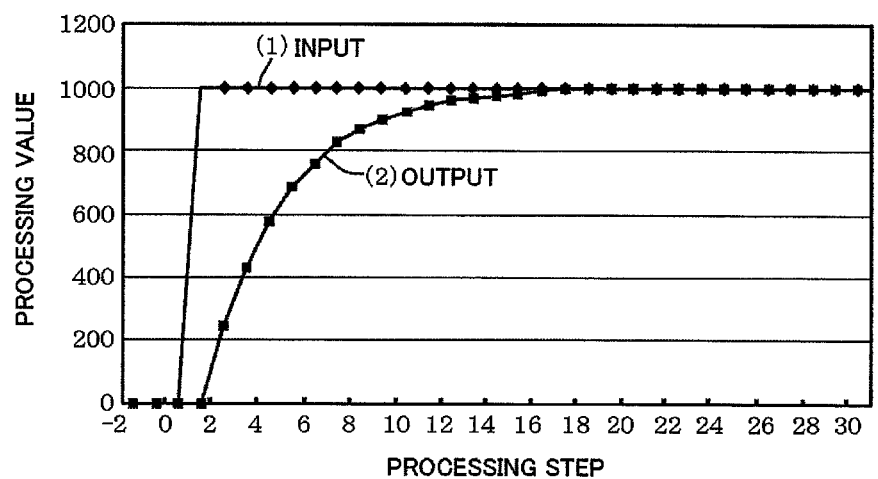
FIG. 9 is a graph illustrating a waveform of the sequential data of FIG. 8.

Assuming that the rounding factor is set to, for example, "$2^{-3}$," and the digital value from the cumulative averaging processing portion 37 is referred to as an "input value," a series or the processing includes multiplying the input value by 12.5% ($2^{-3}$) and adding the result of ("input value"×1.125) and the next input value (input value input to the adder 71 at the next clock). FIG. 8 illustrates waveforms when the input value changes from "0" to "1000" stepwise to show values of each node (A to E) of FIG. 8 in a sequential manner. FIG. 9 illustrates waveforms illustrating the sequential data. That is, the digital filter 7 of FIG. 7 is a circuit configured to gradually increase a step response from zero to converge to a step value as the input value.

Figure 10:
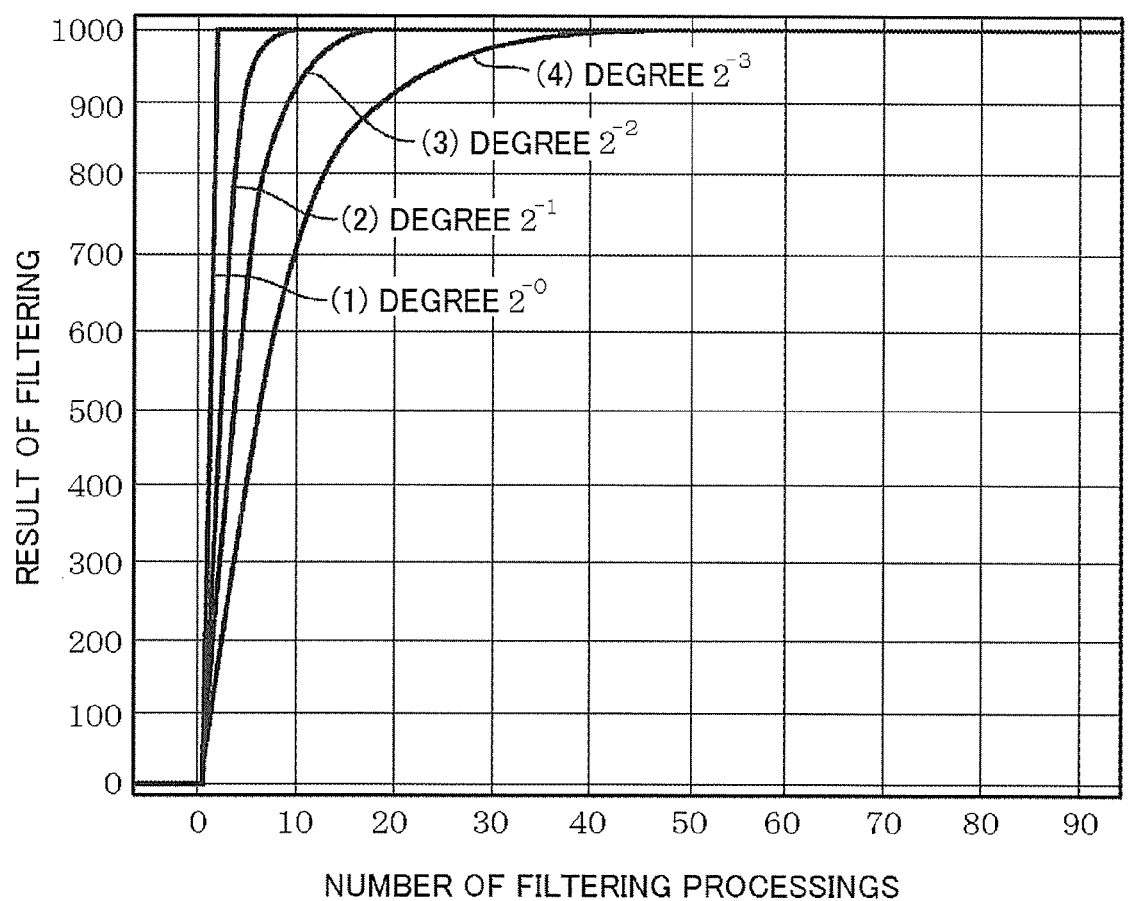
FIG. 10 is an explanatory diagram illustrating impulse-response sequential data when a rounding factor is converted into a parameter in the digital filter.

FIG. 10 is a graph illustrating a change of the output value for the step response obtained by changing the rounding factor, in which the input value of the digital value 7 changes stepwise from "0" to "1000." In FIG. 10, the curves (1) to (4) have the rounding factors (degree) "$2^{0}$," "$2^{-1}$," "$2^{-2}$," and "$2^{-3}$," respectively.

Figure 11:
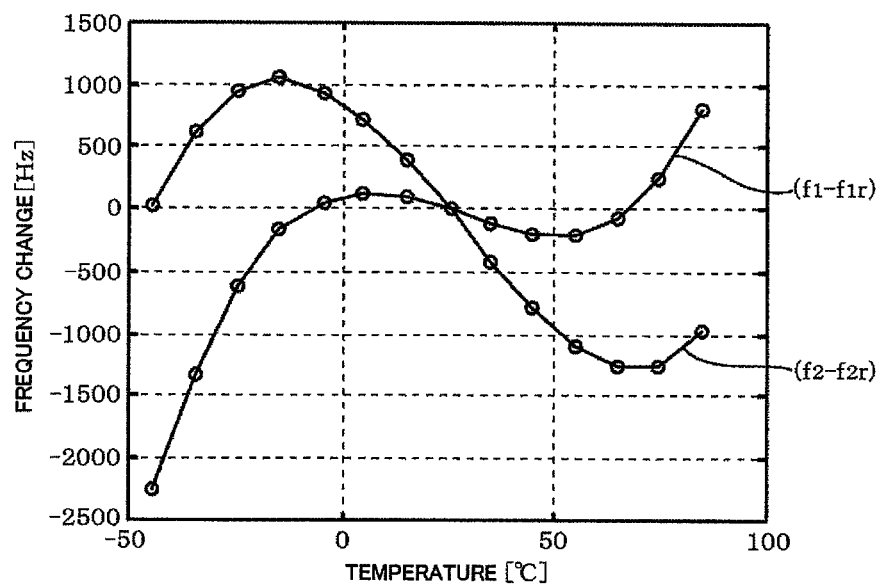
FIG. 11 is a frequency-temperature characteristic diagram illustrating a relationship between a temperature and frequencies f1 and f2 of first and second oscillation circuits.

Here, the frequency deviation information (OSC2−OSC1) corresponding to a temperature change obtained by the loop filter 34 of the PLL will be described with reference to FIGS. 11 to 14. FIG. 11 is a characteristic diagram illustrating a relationship between a temperature and a frequency by normalizing the frequencies f1 and f2 based on a reference temperature. The "normalization" described here means obtaining a relationship between a temperature and a frequency deviation based on a frequency at the reference temperature by setting the reference temperature to 25° C. and setting the frequency at the reference temperature to zero in a temperature-frequency relationship. Assuming that the frequency at a temperature of 25° C. of the first oscillation circuit 1 is denoted by "f1r," and the frequency at a temperature of 25° C. of the second oscillation circuit 2 is denoted by "f2r," that is, assuming that the frequencies f1 and f2 at a temperature of 25° C. are denoted by "f1r" and f2r," respectively, the curves of FIG. 11 show frequency changes "(f1−f1r)" and "(f2−f2r)" depending on a temperature.

Figure 12:
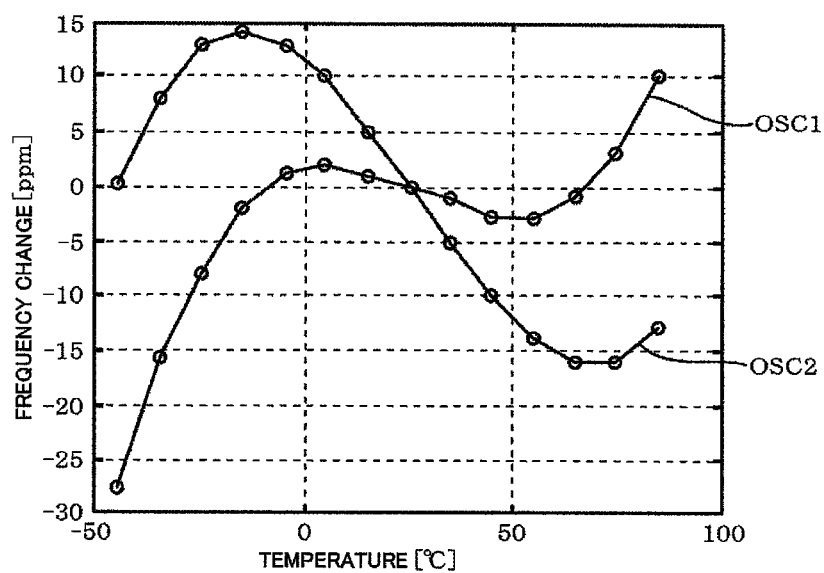
FIG. 12 is a frequency-temperature characteristic diagram illustrating a relationship between a temperature and a value obtained by normalizing a change rate of the frequency f1 and a change rate of the frequency f2 to a value obtained at a reference temperature.

FIG. 12 illustrates a change rate of the frequency at the reference temperature of 25° C. for the frequency at each temperature of FIG. 11. Therefore, the curves of FIG. 12 show "(f1−f1r)/f1r" and "(f2−f2r)/f2r," that is, "OSC1" and "OSC2", respectively, as described above. In addition, the value of the ordinate of FIG. 12 has a unit of [ppm].

Figure 13:
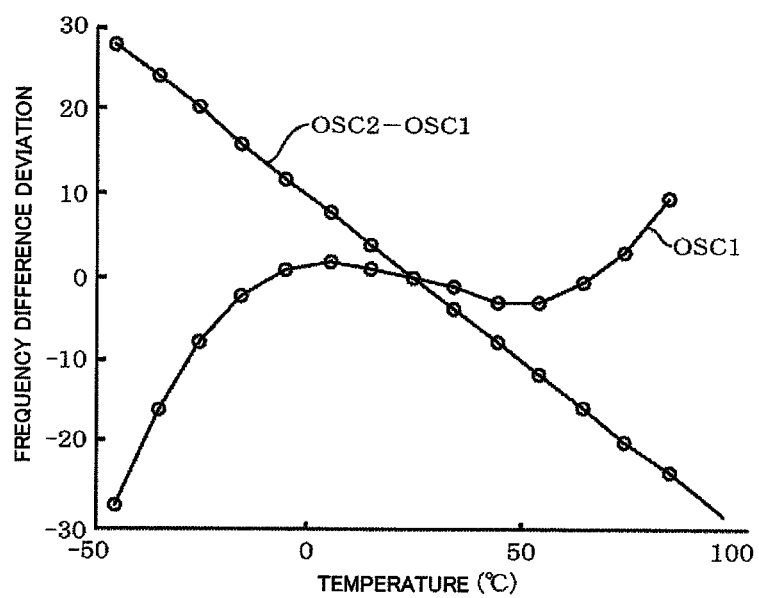
FIG. 13 is a frequency-temperature characteristic diagram illustrating a relationship between a temperature and a difference between "OSC1" and "OSC2" of FIG. 8.

FIG. 13 illustrates a relationship between "OSC1" and a temperature (similar to FIG. 12) and a relationship between "(OSC2−OSC1)" and a temperature. It is recognized that "(OSC2−OSC1)" has a linear relationship with a temperature. Therefore, it is recognized that "(OSC2−OSC1)" corresponds to a deviation corresponding to a temperature change from the reference temperature. In general, a frequency-temperature characteristic of a crystal unit can be expressed as a third-order function. Therefore, if a relationship between "(OSC2−OSC1)" and a frequency correction value for canceling the frequency change using this third-order function is obtained in advance, the frequency correction value can be obtained based on the detection value of "(OSC2−OSC1)."

Figure 14:
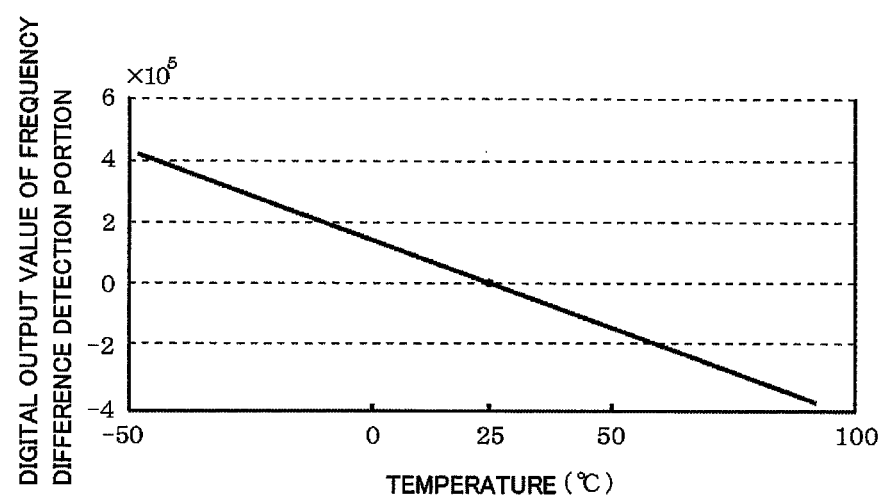
FIG. 14 is a characteristic diagram illustrating a relationship between a temperature and a digital output value of the frequency difference detection portion.

FIG. 14 illustrates a relationship between a temperature and a 34-bit digital value of the output signal of the frequency difference detection portion 3. Therefore, it is recognized that "(OSC2−OSC1)" corresponds to a deviation corresponding to a temperature change from the reference temperature.

Returning to FIG. 1, the output value of the frequency difference detection portion 3 can be substantially treated as the value (OSC2−OSC1) as described above. This value can be referred to as a temperature detection value of the crystal units 10 and 20 as illustrated in FIG. 13. In this regard, a second adder (difference detection circuit) 6 is provided in rear of the frequency difference detection portion 3, and a difference between a temperature setting value as a digital value (34-bit digital value of (OSC2−OSC1) at the setting temperature) and the value "(OSC2−OSC1)" as the output of the frequency difference detection portion 3 is detected. The temperature setting value is preferably selected as a temperature at which the value OSC1 corresponding to the first crystal unit 10 for obtaining the output of the crystal oscillator is not easily changed by a temperature change. This temperature is selected as, for example, 50° C. corresponding to the bottom portion in the curve representing a relationship between "OSC1" and a temperature of FIG. 11. It is noted that the setting temperature may be selected as 10° C. considering that the value of "OSC1" is not easily changed by a temperature change. In this case, this temperature may be lower than a room temperature occasionally. Therefore, a temperature control portion obtained by combining a heating portion and a cooling portion such as a Peltier element is provided.

In addition, a second loop filter 61 corresponding to an integration circuit portion is provided in rear of the second adder 6. A digital-to-analog (D/A) converter 62 is provided in rear of the second loop filter 61. A heater circuit 5 corresponding to the heating portion is provided in rear of the D/A converter 62. In this example, the adder 6, the loop filter 61, and the D/A converter 62 constitute a heating control portion.

Description of Elements Relating to TCXO Functionality

The frequency deviation information corresponding to the temperature change obtained from the loop filter 34 of the PLL is input to the correction value computing portion 4 serving as a correction value obtaining portion in FIG. 1, and the frequency correction value is computed therein. The frequency deviation information corresponding to the temperature change refers to a value corresponding to a difference between the oscillation frequency of the first oscillation circuit 1 when the crystal unit 10 is at the reference temperature and the oscillation frequency of the first oscillation circuit 1 when the crystal unit 10 is at the ambient temperature (temperature in the container that houses the crystal unit 10).

In this example, since the oscillation device has the OCXO functionality, the value corresponding to this difference is typically a constant value. However, when the ambient temperature of the oscillation device changes over an estimated range, the TCXO functionality is exhibited.

In the oscillation device according to an embodiment disclosed here, the frequency signal f1 obtained from the first oscillation circuit 1 is used as the reference clock of the control circuit portion 200 of FIG. 1 as described above, and this reference clock has a frequency-temperature characteristic. Therefore, the temperature compensation is performed for the frequency of the reference clock. For this purpose, first, a function representing a relationship between a temperature and the frequency signal f1 is obtained in advance, and a function for canceling the frequency change of the frequency signal f1 is obtained based on this function. In addition, the correction value computing portion 4 computes the correction signal for canceling the frequency change based on this function and the temperature detection signal obtained from the frequency difference detection portion 3. This will be further described below.

As illustrated in FIG. 1, the first and second crystal units 10 and 20 are formed by commonly using the crystal piece Xb and are thermally combined with each other, so that the frequency difference between the oscillation circuits 1 and 2 accurately matches the ambient temperature of the crystal units 10 and 20. Therefore, the output of the frequency difference detection portion 3 is temperature difference information between the ambient temperature and the reference temperature (in this example, 25° C.). Since the frequency signal f1 output from the first oscillation circuit 1 is used as a main clock of the control portion 200, the correction value obtained from the correction value computing portion 4 is used as a signal for compensating for the operation of the control portion 200 for canceling an influence to the operation of the control portion 200 based on the frequency deviation of the frequency signal f1 caused by a deviation of the temperature from 25° C. As a result, the output frequency of the voltage-controlled oscillator 100 as the output of the oscillation device according to an embodiment disclosed here is stabilized regardless of a temperature change.

Entire Operation of Embodiment

Next, the entire operation according to an embodiment disclosed here will be summarized. The first crystal unit 10 and the first oscillation circuit 1 can be regarded as an oscillator because their outputs are used as a clock of the DDS 201 and the like. That is, it can be said that a crystal oscillator is included in an oscillation device serving as a frequency synthesizer. In this regard, focusing on this crystal oscillator, the output of the crystal oscillator corresponds to the frequency signal output from the first oscillation circuit 1.

In addition, the heating is performed by the heater circuit 5 until the atmosphere round the crystal units 10 and 20 has a desired temperature. The first crystal unit 10 and the first oscillation circuit 1 are used to generate a frequency signal as the output of the crystal oscillator. In addition, the first crystal unit 10 and the first oscillation circuit 1 also serve as a temperature detection portion along with the second crystal unit 20 and the second oscillation circuit 2. The value (OSC2−OSC1) as a frequency difference between the frequency signals obtained from the oscillation circuits 1 and 2 corresponds to a temperature as described above. The adder 6 extracts a difference from the temperature setting value (for example, the value (OSC2−OSC1) at a temperature of 50° C.).

The value (OSC2−OSC1) as the frequency difference is obtained from the frequency detection portion 3 based on the operation described above using the circuit of FIG. 2. In addition, the digital value obtained from the loop filter 34 is accumulated in the cumulative averaging processing portion 37 by a predetermined sampling count, and the rounding is performed based on a predetermined rounding factor (multiplication of $2^{-n}$). The digital value obtained in the cumulative averaging processing portion 37 is input to the digital filter 7, and a waveform of the sequential data of the temperature correction value containing a group of the digital values is rectified. That is, the digital value obtained from the loop filter 34 is rectified by the cumulative averaging processing portion 37 and is further rectified by the digital filter 7.

The digital value of the temperature detection value obtained in this manner is input to the correction value computation portion 4, where a correction value of the setting frequency of the frequency synthesizer is obtained. This correction value and the setting frequency read from the memory 30 are added and input to the DDS 201. Then, an oscillation output is extracted from the voltage-controlled oscillator 100 as described above.

Effects of Embodiment

As described above, according to the embodiment described above, a pair of crystal units 10 and 20 are employed, and the value corresponding to a difference between the oscillation frequencies of the crystal units 10 and 20 is treated as a temperature detection value and is obtained as a digital value. This digital value is accumulated, and the accumulation value is averaged (rounding). In addition, the digital value subjected to the cumulative averaging is input to the digital filter 7, where a waveform of a group of digital values is rectified. Then, the frequency setting value of the oscillation device is corrected based on the value subjected to the rectification. For this reason, it is possible to suppress a circuit size in a rear stage and avoid a phase noise problem in the oscillation output caused by a change of the digital value.

Figure 15A:
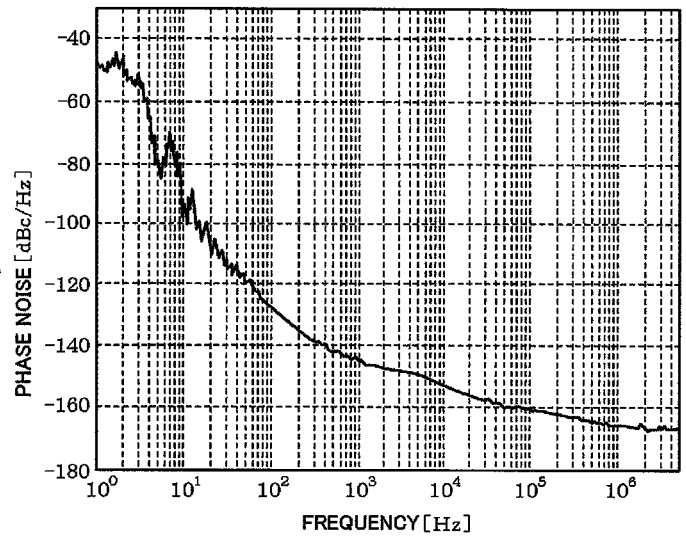
FIGS. 15A and 15B are characteristic diagrams illustrating a phase noise characteristic of the oscillation device as a comparative example.
Figure 15B:
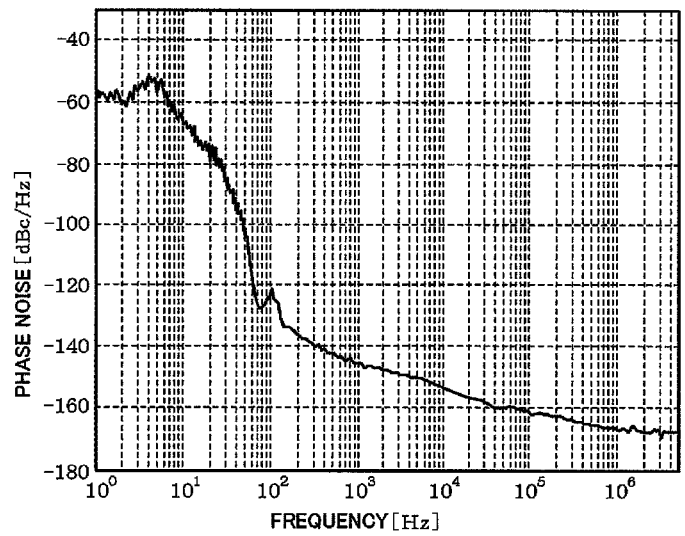
Figure 16A:
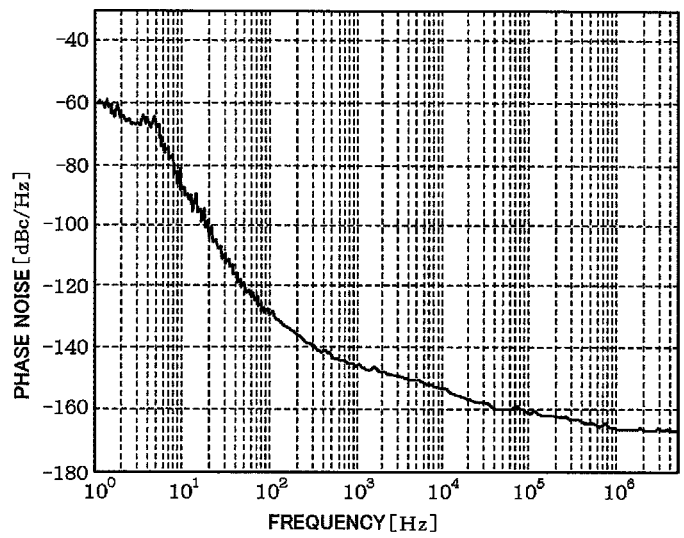
FIGS. 16A and 16B are characteristic diagrams illustrating a phase noise characteristic of the oscillation device according to an embodiment disclosed here.
Figure 16B:
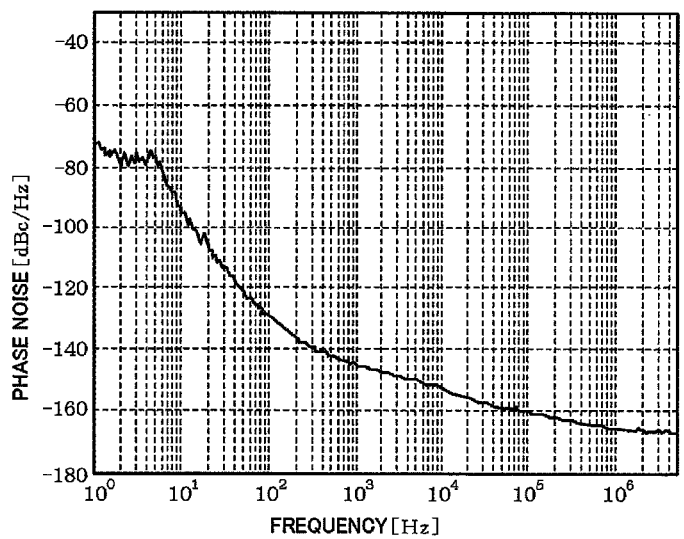

FIGS. 15A and 15B illustrate phase noise characteristics in an actual measurement test when a setting value of the output frequency of the frequency synthesizer is set to 19.2 MHz, and the frequency correction value is obtained based on the output value of the cumulative averaging processing portion 37 without using the digital filter. FIGS. 16A and 16B illustrate simulation results of the phase noise characteristic when the setting value of the output frequency of the frequency synthesizer is set to 19.2 MHz, and the rounding factors of the digital filter 7 are set to "$2^{-4}$" and "$2^{-7}$," respectively. In the case of FIG. 15A, the accumulation value (accumulation number) of the cumulative averaging processing portion 37 is set to "$2^{14}$," and no digital filter is employed. In the case of FIG. 15B, the accumulation number is set to "$2^{10}$," and no digital filter is employed. In the case of FIG. 16A, the accumulation number is set to "$2^{10}$," and the rounding factor of the digital filter is set to "$2^{-4}$." In the case of FIG. 16B, the accumulation number is set to "$2^{10}$," and the rounding factor of the digital filter is set to "$2^{-7}$." From this result, it is recognized that a phase noise characteristic is improved by providing the digital filter 7. When the rounding factor of the filter rounding processing portion is set to a value selected from a group consisting of, for example, "$2^{-4}$", "$2^{-5}$", "$2^{-6}$" and "$2^{-7}$.", good phase noise characteristic is provided. However the rounding factor is not restricted to those values but may be determined corresponding to required characteristic for the oscillation device.

Figure 17:
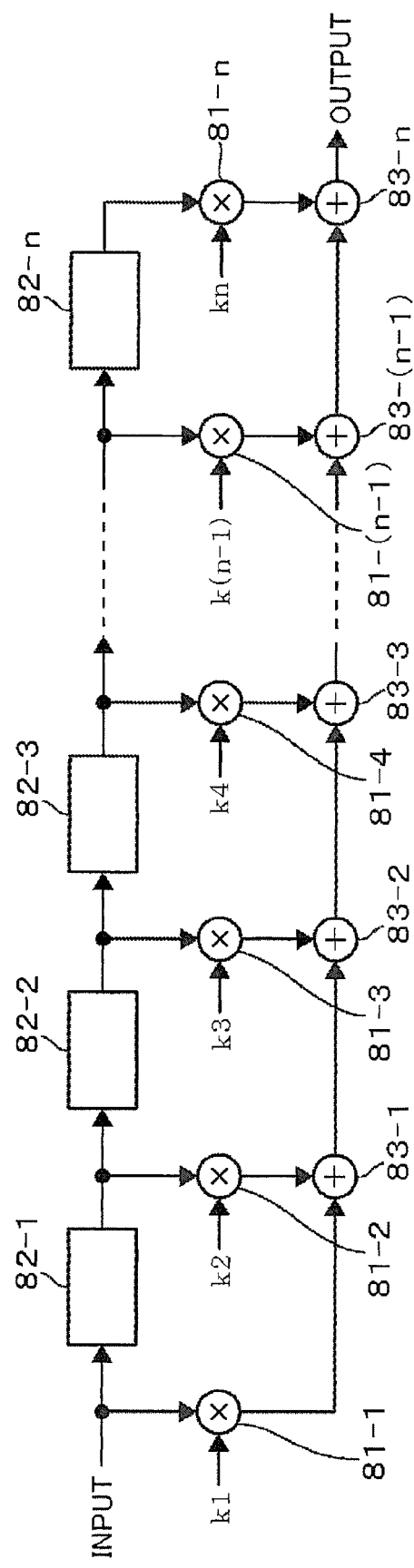
FIG. 17 is a block circuit diagram illustrating another exemplary digital filter.

As the digital filter 7, without limiting to the configuration of FIG. 7, an finite impulse response (FIR) filter illustrated in FIG. 17 may also be employed. In FIG. 17, there are illustrated multipliers (rounding processing portion) 81-1 to 81-$n$, delay circuits 82-1 to 82-$n$ that delay the output by one clock, and adders 83-1 to 83-$n$. The values k1 to kn is smaller than "1." A filter characteristic is controlled by adjusting the number of stages of the delay circuit and the rounding processing portion or the values k1 to kn. Using the digital filter 7 of FIG. 17, tt is possible to obtain the same impulse response as that of the digital filter 7 of FIG. 2.

Others

Although the crystal piece Xb is commonly used between the first and second crystal units 10 and 20 in the example described above, the crystal piece Xb may not be commonly used. In this case, for example, the first and second crystal units 10 and 20 may be disposed in a common casing. In this configuration, since the first and second crystal units 10 and 20 are disposed in substantially the same temperature atmosphere, the same effect can be obtained.

The output signal of the DDS circuit portion 36 of the frequency difference detection portion 3 may be any frequency signal whose signal value repeats rising and falling along time without limiting to a sawtooth wave. For example, the output signal of the DDS circuit portion 36 may be a sinusoidal wave. In addition, the frequency difference detection portion 3 may be configured such that the frequencies f1 and f2 are counted using a counter, the value corresponding to "Δfr" is subtracted from a difference value of the count value, and a value corresponding to the obtained count value is output.

In the embodiment described above, the first crystal unit 10 and the first oscillation circuit 1 have functionalities of obtaining the temperature detection value and creating the output of the crystal oscillator. That is, the oscillation circuit 1 commonly uses the oscillation circuit for detecting a temperature and the oscillation circuit for the output of the crystal oscillator. However, the embodiment disclosed here may be modified such that, for example, three crystal units are prepared, and three oscillation circuits are prepared. For example, in the configuration of FIG. 1, a third crystal unit and a third oscillation circuit connected to the third crystal unit may be prepared, so that the temperature detection value may be obtained by using the output of the third oscillation circuit as the output of the crystal oscillator and inputting the oscillation outputs of the first and second oscillation circuits to the frequency difference detection portion. In this case, if the OCXO and the TCXO are combined, the output of the third crystal oscillation circuit is used as a clock of the DDS 201.

However, the embodiment disclosed here may be modified in various manners without limiting to a configuration of the frequency synthesizer. For example, the oscillation output of the first oscillation circuit 1 may be used as the output of the oscillation device according to the embodiment disclosed here. That is, the control circuit portion 200 may not be used.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. An oscillation device that corrects a setting value of an output frequency based on a detection result of an ambient temperature of a crystal unit, the oscillation device comprising:
    an oscillation circuit used for an output of an oscillator connected to a crystal unit or an oscillator output;
    a temperature detection portion that detects the ambient temperature and outputs a digital value corresponding to the temperature detection value;
    an accumulator that accumulates the digital value based on a predetermined accumulation number;
    a first rounding processing portion that performs rounding for the digital value accumulated in the accumulator based on a predetermined rounding factor;
    a digital filter that receives a digital value obtained from the first rounding processing portion and obtains a step response gradually increasing from "0" and converging to a step value which is an input value; and
    a correction value obtaining portion that obtains a frequency correction value of the oscillation frequency of the oscillation circuit caused by a difference between the ambient temperature and a reference temperature based on an output value of the digital filter,
    wherein the setting value of the output frequency is corrected based on the frequency correction value obtained from the correction value obtaining portion.

2. The oscillation device according to claim 1, wherein the temperature detection portion includes:
   first and second oscillation circuits connected to first and second crystal units, respectively, for detecting a temperature, and
   a frequency difference detection portion that obtains, as the temperature detection value, a digital value corresponding to a difference value between a value corresponding to a difference between frequencies f1 and f1r and a value corresponding to a difference between frequencies f2 and f2r, where "f1" denotes an oscillation frequency of the first oscillation circuit, "f1r" denotes an oscillation frequency of the first oscillation circuit at the reference temperature, "f2" denotes an oscillation frequency of the second oscillation circuit, and "f2r" denotes an oscillation frequency of the second oscillation circuit at the reference temperature.

3. The oscillation device according to claim 1, further comprising:
   a heating portion for constantly maintaining an ambient temperature of the crystal unit;
   a difference computation portion that computes a difference value between the temperature detection value detected from the temperature detection portion and a temperature setting value corresponding to a desired temperature; and
   a heating control portion that controls the heating portion based on the difference value.

4. The oscillation device according to claim 2, wherein the crystal unit for the oscillator output is also used as the first crystal unit.

5. The oscillation device according to claim 1, wherein the digital filter includes
   an adder that receives the digital value obtained from the first rounding processing portion,
   a delay circuit that receives an addition value obtained from the adder, delays the addition value by one clock, and outputs a delayed addition value,
   a second rounding processing portion that multiplies the delayed addition value output from the delay circuit by "$2^{-n}$" and outputs a digital value as an output value of the digital filter, where "n" denotes any integer equal to or greater than "1"; and
   a subtractor that subtracts the digital value obtained from the second rounding processing portion, from the delayed addition value output from the delay circuit, and
   the adder adds the digital value obtained from the first rounding processing portion and a digital value obtained from the subtractor.

6. The oscillation device according to claim 5, wherein a rounding factor of the second rounding processing portion is set to a value selected from a group consisting of "$2^{-4}$", "$2^{-5}$", "$2^{-6}$" and "$2^{-7}$".

7. The oscillation device according to claim 5, wherein a rounding factor of the second rounding processing portion used in the digital filter is capable of being designated by an external computer.

8. The oscillation device according to claim 1, wherein the digital filter is a infinite impulse response digital filter or a finite impulse response digital filter.

* * * * *